United States Patent [19]

Ohtaka

[11] Patent Number: 4,866,280
[45] Date of Patent: Sep. 12, 1989

[54] OBJECTIVE LENS OF AN ELECTRON BEAM APPARATUS

[75] Inventor: Tadashi Ohtaka, Katsuta, Japan
[73] Assignee: Hitachi, Ltd., Tokyo, Japan
[21] Appl. No.: 311,382
[22] Filed: Feb. 16, 1989

Related U.S. Application Data

[63] Continuation of Ser. No. 60,605, Jun. 11, 1987, abandoned.

[30] Foreign Application Priority Data

Jun. 11, 1986 [JP] Japan .................... 61-133676

[51] Int. Cl.⁴ ................................ G21K 5/10
[52] U.S. Cl. ................ 250/442.1; 250/440.1; 250/396 ML
[58] Field of Search .......... 250/442.1, 440.1, 311, 250/396 ML

[56] References Cited

U.S. PATENT DOCUMENTS

| | | | |
|---|---|---|---|
| 3,526,766 | 9/1970 | Riecke | 250/442.1 |
| 4,170,737 | 10/1979 | Bobrou et al. | 250/442.1 |
| 4,292,523 | 9/1981 | Hoppe | 250/442.1 |
| 4,596,934 | 6/1986 | Yanaka et al. | 250/442.1 |

FOREIGN PATENT DOCUMENTS 55-136446 10/1980 Japan .

OTHER PUBLICATIONS

"Hitachi S-600 Field Emission CD-Measurement SEM", Ohtaka et al., Int. Soc. for Optical Engineering, 1985, Aug.

Primary Examiner—Bruce C. Anderson
Attorney, Agent, or Firm—Antonelli, Terry & Wands

[57] ABSTRACT

An objective lens of an electron beam apparatus in which an electron beam emitted from an electron gun is converged onto a specimen, the reflected electron from the specimen or the secondary electron emitted therefrom is detected, and a fine pattern on the specimen is measured, comprises: a magnetic circuit consisting of an upper magnetic pole member having an opening adapted to transmit the electron beam to be converted which was emitted from the electron gun, a lower magnetic pole member provided so as to face the upper magnetic pole member, and a magnetic path member to connect the outer peripheral edges of the upper and lower magnetic pole members; a coil, provided for a part of the magnetic circuit, for generating the magnetic fluxes passing through the upper and lower magnetic pole members, the magnetic path member, and the space between the opening edge and the lower magnetic pole member when this coil is excited; and a moving apparatus which is disposed on the surface of the lower magnetic pole member opposite to the upper magnetic pole member and is movable on the plane perpendicular to the electron beam in the magnetic circuit in the state in which the specimen is put on the upper surface of the moving apparatus.

6 Claims, 3 Drawing Sheets

OBJECTIVE LENS OF AN ELECTRON BEAM APPARATUS

This application is a continuation of application Ser. No. 60,605, filed June 11, 1987 abandoned.

BACKGROUND OF THE INVENTION

The present invention relates to an objective lens for converging an electron beam which is suitable for use in an electron beam apparatus such as an electron beam length measuring machine, scanning electron microscope, or the like such that an electron beam is converged onto a specimen such as a semiconductor wafer or the like, the reflected electron or secondary electron from the specimen is detected, thereby measuring and evaluating a fine pattern on the specimen.

Hitherto, in the scanning type or transmitting type electron microscope, as disclosed in, e.g., JP-A-55-136446, there has been known an in-lens system in which a specimen is disposed between the upper and lower magnetic pole members of the objective lens, the objective lens is strongly excited, and an electron beam is converged onto the specimen. In this case, since the focal distance is reduced and the lens aberration can be reduced, a pattern on the surface of the specimen can be observed with the high resolution. However, the specimen which can be led into the objective lens is limited to a very small specimen having a diameter of about 3 to 6 mm. In addition, since it is necessary to move the specimen in the direction of the plane perpendicular to the electron beam and to be inclined to this plane, the specimen is disposed on the edge of a movable arm. However, this arm is easily vibrated by the external vibration and the position of the specimen easily fluctuates for the electron beam, so that it is difficult to obtain an image with a high resolution.

On the other hand, as an electron beam apparatus to measure and evaluate the specimen of a large diameter such as a semiconductor wafer (having a diameter of 8 inches), magnetic disc (having a diameter of 14 inches), or the like, the electron microscope shown in JP-A-55-136446 or the electron beam length measuring machine shown in "The International Society for Optical Engineering", 1985, August has been known. In this case, as shown in FIG. 1, a specimen 15 of a large diameter is disposed below a lower magnetic pole 12 of the objective lens 8 so as to be movable in the horizontal direction, thereby enabling the whole surface of the specimen to be observed. Further, the specimen 15 is arranged near the lower magnetic pole 12 as close as possible, thereby reducing the focal distance and decreasing the aberration of the lens. However, since the space between an upper magnetic pole 10 and the lower magnetic pole 12, the thickness of lower magnetic pole 12, and the space between the lower magnetic pole 12 and the specimen 15 exist, there is a limitation in reduction of the focal distance and the focal distance can be reduced to only a value of about 10 mm. Consequently, there is a limitation to obtain the high resolution.

In FIG. 1, reference numeral 2 denotes an electron gun; 4 is an electron beam; 6 a capacitor lens; 7 a deflecting coil; 10 the upper magnetic pole; 14 an exciting coil; and 16 a secondary electron detector.

SUMMARY OF THE INVENTION

It is an object of the present invention to provide an objective lens in which a fine pattern on a thin specimen of a large diameter can be measured and evaluated with a high resolution and the aberration is small and the resolution is high.

To accomplish this object, according to the present invention, a specimen is disposed into the space between the upper and lower magnetic poles of an objective lens, the focal distance of the lens is reduced, the aberration of the lens is remarkably decreased, a magnetic circuit of the objective lens is used commonly with a specimen chamber, and thereby miniaturizing the apparatus. Further, a moving apparatus which is movable in the horizontal direction with the specimen disposed thereon is provided on the lower magnetic pole, thereby enabling the whole surface of the specimen of a large diameter to be observed and assuring the stability of the relative position to the electron beam of the specimen for the external vibration.

DESCRIPTION OF THE PREFERRED EMBODIMENTS

A typical embodiment of the present invention will be described hereinbelow.

Figure 2:
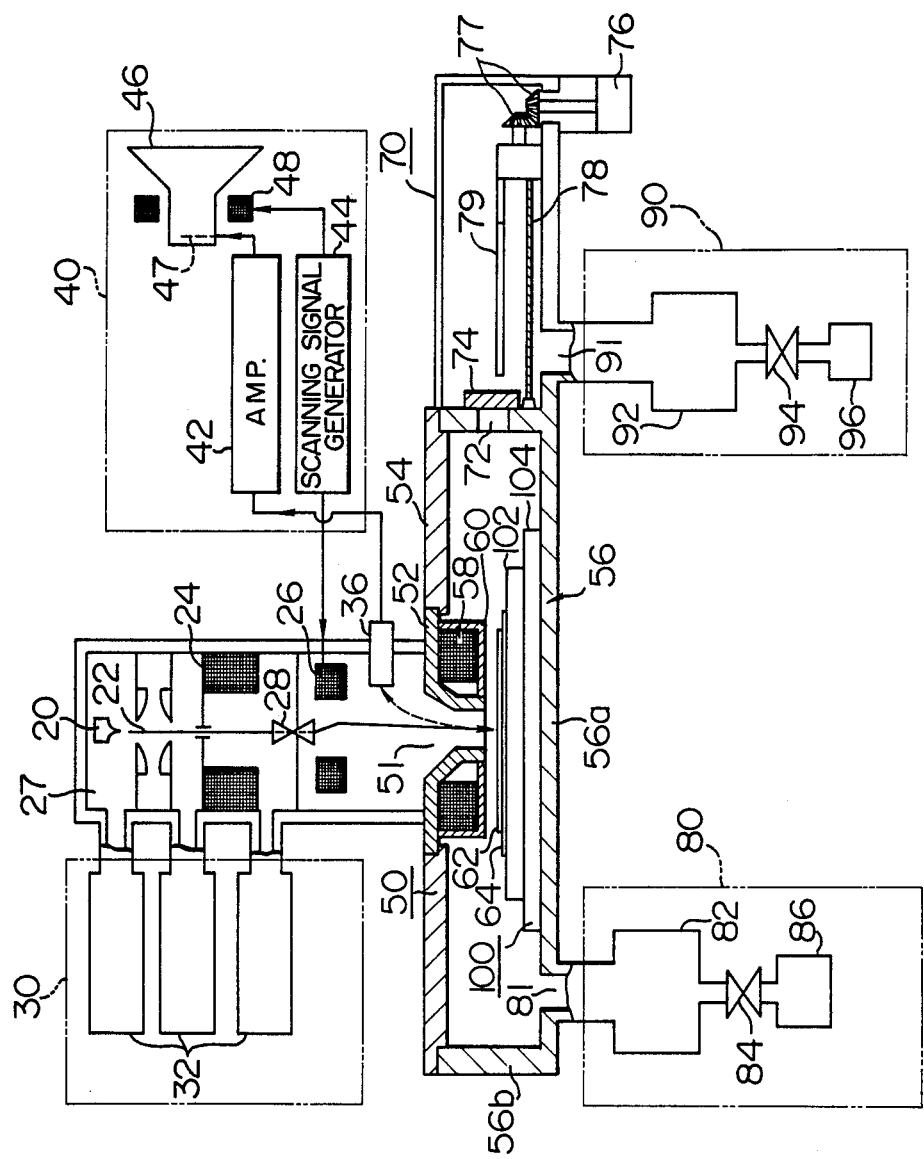
FIG. 2 is a schematic diagram in the case where the first embodiment of an objective lens according to the present invention is applied to an electron beam length measuring machine.

FIG. 2 shows a schematic diagram in the case where an embodiment of an objective lens according to the invention was applied to an electron beam length measuring machine.

In FIG. 2, reference numeral 20 denotes an electron gun; 22 is an electron beam; 24 an exciting coil of a condenser lens; 26 a deflecting coil; 27 a gun chamber; 28 an air valve; 30 an air evacuation system of the gun chamber 27; 32 an ion pump; 36 a secondary electron detector; 40 a display unit to display the output of the detector 36 on a CRT 46; 42 an amplifier; 47 a cathode of the CRT 46; 44 a scanning signal generator; and 48 a deflecting coil.

Since those constitutions are well known, their descriptions are omitted.

Reference numeral 50 denotes the first embodiment of the objective lens of the invention; 52 is an upper magnetic pole member having an aperture 51 to transmit the electron beam 22; 56 a lower magnetic pole member arranged so as to face the upper magnetic pole member 52; and 54 a magnetic path member to connect the outer peripheral edges of the upper and lower magnetic pole members. The members 52, 54, and 56 are made of a magnetic material such as pure iron permalloy, or the like and form a magnetic circuit.

Numeral 58 denotes an exciting coil. When the exciting coil 58 is excited, the coil generates the magnetic fluxes passing through the magnetic circuit consisting of the upper and lower magnetic pole members 52 and 56 and magnetic path member 54 and through the space between the aperture portion of the upper magnetic pole member 52 and the lower magnetic pole member 56. The coil 58 is held by a coil holding metal fitting 60 made of a non-magnetic material such as e.g., phosphor bronze, aluminum, or the like.

A specimen 62 disposed on a specimen holder 64 is arranged between the upper magnetic pole member 52 and the lower magnetic pole member 56. Further, the holder 64 is disposed on a moving apparatus 100 having an X moving table 102 and a Y moving table 104 which are movable on the upper surface of a bottom portion 56a of the lower magnetic pole member 56.

Therefore, the magnetic circuit is also used as a specimen chamber in which the specimen is enclosed.

An opening 81 is formed in a part of the magnetic circuit, e.g., in the lower magnetic pole member 56. The inside of the magnetic circuit is set to the vacuum state by a rotary pump 86 through an air valve 84 and a turbo molecular pump 82.

Further, an opening 72 is formed in another part of the magnetic circuit, for example, in the lower magnetic pole member 56. The opening 72 is communicated with a specimen exchange chamber 70 through a gate valve 74. The specimen exchange chamber 70 is used to dispose the specimen 62 onto the specimen holder 64, to move the holder 64 to the objective lens side, and to load the holder 64 onto the X moving table 102 through the gate valve 74.

Namely, the specimen exchange chamber 70 includes: a motor 76 to drive a gear 77; a feed screw 78 which is rotated by the rotation of the gear 77; and a chucking mechanism 79 which is fed into the objective lens 50 by the rotation of the feed screw 78 and is moved into the exchange chamber 70 from the objective lens.

In the case of putting a specimen into the objective lens, the chucking mechanism 79 holds the specimen holder 64 on which the specimen is disposed and then opens the gate valve 74. The chucking mechanism is fed into the objective lens by the rotation of the motor and put on the X moving table 102.

When the specimen is put into the exchange chamber from the objective lens, the chucking mechanism is fed into the objective lens and holds the specimen holder. In this state, the motor is reversely rotated and the specimen holder is led into the exchange chamber and the gate valve is closed.

The chucking mechanism may be also manually driven without using the motor.

An opening 91 is formed in a part of the outer wall of the specimen exchange chamber 70. The air in the exchange chamber is evacuated into the vacuum state by an evacuation system 90 having a turbo molecular pump 92, an air valve 94, and a rotary pump 96.

Figure 3:
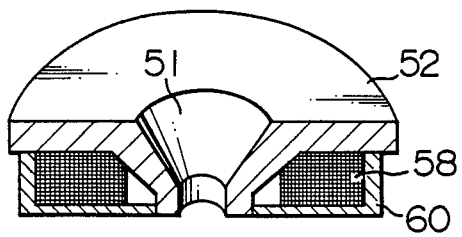
FIG. 3 is a cross sectional view of an upper magnetic pole member of the objective lens shown in FIG. 2.
Figure 4:
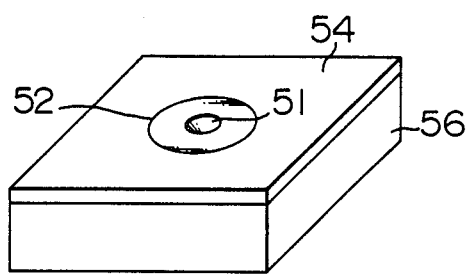
FIG. 4 is an external view of the objective lens in FIG. 2.
Figure 5:
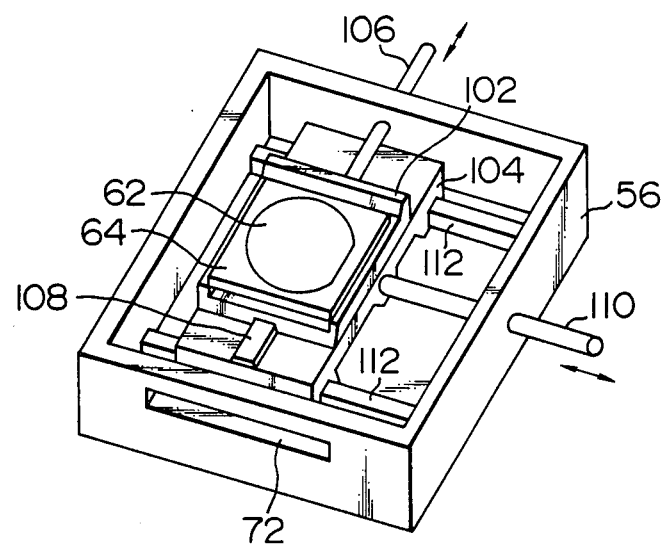
FIG. 5 is a perspective view of a moving apparatus of the objective lens shown in FIG. 2.

FIG. 3 shows a cross sectional view of the upper magnetic pole member 52 having the exciting coil 58 held by the coil holding metal fitting 60. FIG. 4 shows an external view of the objective lens. FIG. 5 is a perspective view showing the objective lens in the state in which the upper magnetic pole member was removed. A constitution of the moving apparatus 100 will be explained with reference to FIG. 5. The Y moving table 104 is slidably disposed on two rails 112 attached on the upper surface of the bottom portion 56a of the lower magnetic pole member 56. The Y moving table 104 is moved in the direction of the Y axis along the rails 112 by a Y-direction drive shaft 110 which is moved in the direction of the Y axis by a motor (not shown).

Further, one rail 108 is attached on the upper surface of the Y moving table 104. The X moving table 102 is slidably disposed on the rail 108. The X moving table 102 is moved along the rail 108 in the direction of the X axis by an X-direction drive shaft 106 which is moved in the direction of the X axis by a motor (not shown).

The specimen holder 64 on which the specimen 62 is set is fixed onto the X moving table 102 by a stopper (not shown). Therefore, by moving the X and Y moving tables, an electron beam can be irradiated to a desired position of the specimen.

Each of the component elements of the moving apparatus and the specimen holder 64 are made of a non-magnetic material such that even if the specimen 62 was moved, the magnetic field which is generated in the gap between the upper and lower magnetic pole members is not fluctuated.

In the objective lens constituted as described above, since the specimen 62 is set between the upper and lower magnetic pole members, the focal distance of the objective lens can be fairly reduced to a value below 10 to 1 mm and the spherical aberration and chromatic aberration can be decreased. Therefore, as compared with the conventional system such that a specimen is disposed in the outside of the objective lens, the focal distance of the lens can be reduced to a value below $\frac{1}{3}$ to 1/5 of that of the conventional system. Therefore, the diameter of electron beam can be also almost proportionally reduced and an image of a high resolution can be derived. Further, since the magnetic paths which are formed by the magnetic path member 54 and lower magnetic pole member 56 can be directly commonly used as a specimen chamber, the structure of the electron beam apparatus can be simplified and miniaturized. Further, such a specimen chamber is formed of a magnetic material such as a pure iron, permalloy, or the like. The effect of the magnetic shield to the electron beam 22 is large. The electron beam and secondary electron are extremely stable to a fluctuation in external magnetic field.

Moreover, the X moving table 102 and Y moving table 104 are disposed on the lower magnetic pole member 56 as a base plate and the specimen 62 such as a wafer or the like is set on these moving tables. Therefore, the relative position of the specimen to the electron beam 22 is very stable for the external vibration. The measurement accuracy does not deteriorate for the external vibration and the image of a high resolution can be derived.

In this manner, the magnetic paths and specimen chamber are commonly used and miniaturized, so that the total space of the magnetic paths and specimen chamber becomes small and, accordingly, this embodiment is also advantageous to evacuate the air in this space so as to become the vacuum state.

The second embodiment of the objective lens according to the invention will now be described with reference to FIG. 6. As will be understood from this diagram, in this embodiment, almost the central portion (the portion which faces the opening 51 of the upper magnetic pole member 52) of the bottom portion 56a of the lower magnetic pole member 56 is projected to the side of the upper magnetic pole member 52 to form a projecting portion 56c, thereby reducing the gap between the upper and lower magnetic pole members.

Therefore, when the coil 58 was excited by the same current, in the case of the second embodiment, the magnetic flux density between the upper and lower magnetic pole members can be raised and the efficiency is improved as compared with the first embodiment. Thus, the focal distance can be reduced, the lens aberration can be decreased more, and the resolution can be improved.

In the second embodiment, the central portions of X and Y moving tables 102' and 104' are bored, thereby enabling the moving tables to be smoothly moved for the projecting portion 56c of the lower magnetic pole members.

The shape of the objective lens according to the invention is not limited to a rectangular paralelepiped as shown in FIG. 4 but may be a cyclindrical shape.

Figure 6:
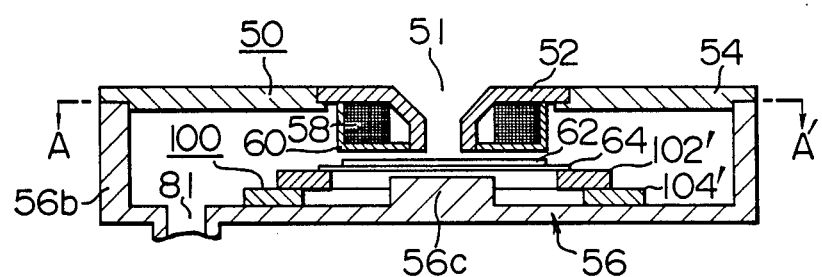
FIG. 6 is a cross sectional view showing the second embodiment of the objective lens according to the invention.

On the other hand, although the specimen has been set and exchanged in the specimen exchange chamber 70 through the gate valve 74, it is also possible to downwardly move the lower magnetic pole member 56 along the line A—A' in FIG. 6 and to remove it from the upper magnetic pole member 52 and to exchange the specimen in this state.

In the objective lens of the invention, a thin specimen of a large diameter such as e.g., semi-conductor wafer (having a diameter of 6 or 8 inches), magnetic disc (having a diameter of 14 inches), laser disc (having a diameter of 8 inches), thin film head, etc. can be used as a specimen. The whole surface of each of those specimens can be measured.

Figure 1:
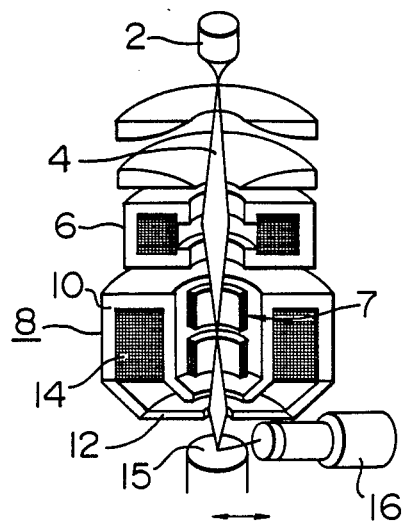
FIG. 1 is a cross sectional view of the main section of an example of a conventional electron beam apparatus.

The objective lens of the invention can be used in not only the elctron beam length measuring machine but also the electron microscope shown in FIG. 1 and further can be also used in an electron beam drawing apparatus or the like.

According to the invention, the focal distance is reduced, the aberration of the objective lens is decreased, and an image of a high resolution can be also obtained even in the case of specimen of a large diameter. Further, the magnetic path of the objective lens and specimen chamber can be commonly used, so that this apparatus is hardly influenced by the disturbance magnetic field. In addition, since the specimen stage is disposed on the lens magnetic path as a base, the apparatus is also strong for the disturbance vibration. It is possible to obtain the apparatus which has the high performance and is also extremely strong for a change in circumstances.

I claim:

1. An objective lens of an electron beam apparatus in which an electron beam emitted from an electron gun is converged onto a specimen, the reflected electron from the specimen or the secondary electron emitted therefrom is detected, and a fine pattern on the specimen is measured, said lens comprising:

a magnetic circuit structure including an upper magnetic pole member having an opening to transmit the electron beam to be converged which was emitted from said electron gun, a lower magnetic pole member disposed so as to face said upper magnetic pole member, and a magnetic path member to connect the outer peripheral edges of the upper and lower magnetic pole members;

a coil, arranged in a part of said magnetic circuit structure, for generating magnetic fluxes passing through said upper and lower magnetic pole members, said magnetic path member, and the space between said opening edge and the lower magnetic pole member when said coil is excited; and moving means which is disposed on the surface of the lower magnetic pole member opposite to the upper magnetic pole member and is movable on the plane substantially perpendicular to said electron beam in a space enclosed by said magnetic circuit structure in the state in which the specimen is put on the upper surface of said moving means.

2. An objective lens according to claim 1, further having a projecting portion in the portion of said lower magnetic pole member opposite to the opening of said upper magnetic pole member, said projecting portion projecting toward the side of said opening.

3. An objective lens according to claim 1, wherein a part of the side wall of said magnetic circuit structure has an opening portion and said specimen is disposed onto said moving means through said opening portion.

4. An objective lens according to claim 1, wherein said upper and lower magnetic pole members of said magnetic circuit structure are arranged so as to enable movement of at least one of said upper and lower magnetic pole members in the direction of the electron beam.

5. An objective lens according to claim 1, wherein said moving means has a first moving member which is movable on the upper surface of said lower magnetic pole member in the directions along one axis and a second moving member which is mounted on said first moving member and is movable in the direction along the axis perpendicular to said axis, and said specimen is disposed on said second moving member.

6. An objective lens according to claim 1, wherein said upper magnetic pole member, said lower magnetic pole member and said magnetic path member are disposed so as to delimit a chamber in which the specimen is received and which provides a magnetic shielding effect with respect to the electron beam.

* * * * *